(12) United States Patent
Adamec

(10) Patent No.: US 7,659,514 B2
(45) Date of Patent: Feb. 9, 2010

(54) ASYMMETRIC ANNULAR DETECTOR

(75) Inventor: Pavel Adamec, Haar (DE)

(73) Assignee: ICT, Integrated Circuit Testing Gesellschaft fur Halbleiterpruftechnik mbH, Heimstetten (DE)

( * ) Notice: Subject to any disclaimer, the term of this patent is extended or adjusted under 35 U.S.C. 154(b) by 0 days.

(21) Appl. No.: 11/849,768

(22) Filed: Sep. 4, 2007

(65) Prior Publication Data

US 2008/0061244 A1 Mar. 13, 2008

(30) Foreign Application Priority Data

Sep. 7, 2006 (EP) .................................. 06018788

(51) Int. Cl.
*G01T 1/20* (2006.01)
(52) U.S. Cl. .................................... 250/368
(58) Field of Classification Search .................. 250/368
See application file for complete search history.

(56) References Cited

U.S. PATENT DOCUMENTS

| 4,700,075 | A | | 10/1987 | Kurz et al. | |
|---|---|---|---|---|---|
| 5,198,675 | A | * | 3/1993 | Hikita et al. | 250/397 |
| 6,498,345 | B1 | * | 12/2002 | Weimer et al. | 250/310 |
| 2002/0171030 | A1 | | 11/2002 | Howells | |

FOREIGN PATENT DOCUMENTS

| EP | 0872873 A2 | | 10/1998 |
|---|---|---|---|
| JP | 62140069 A | * | 6/1987 |
| JP | 07192678 | | 7/1995 |

OTHER PUBLICATIONS

European Search Report dated Feb. 21, 2007.

* cited by examiner

*Primary Examiner*—David P Porta
*Assistant Examiner*—Shun Lee
(74) *Attorney, Agent, or Firm*—Patterson & Sheridan, LLP

(57) ABSTRACT

An assembly for a detection unit for an optical device is described. The assembly includes a scintillator adapted to received secondary particles and, in response, generate photons, wherein the scintillator includes an opening for trespassing of a primary beam through the scintillator. The scintillator including the opening is asymmetrical with regard to one axis.

16 Claims, 4 Drawing Sheets

ASYMMETRIC ANNULAR DETECTOR

CROSS-REFERENCE TO RELATED APPLICATIONS

This application claims priority to European Patent Application No. 06018788.7, filed Sep. 7, 2006, which is herein incorporated by reference.

FIELD OF THE INVENTION

The invention generally relates to a charged particle beam device and method of imaging or patterning a specimen with a charged particle beam, particularly for inspection applications, testing applications, lithography applications and the like. More particularly, it relates to a detection unit for a charged particle beam device. Specifically, it relates to an assembly for a detection unit for an optical device.

BACKGROUND OF THE INVENTION

Charged particle beam apparatuses have many functions in a plurality of industrial fields, including, but not limited to, inspection of semiconductor devices during manufacturing, exposure systems for lithography, detecting devices and testing systems. Thus, there is a high demand for structuring and inspecting specimens within the micrometer and nanometer scale.

Micrometer and nanometer scale process control, inspection or structuring, is often done with charged particle beams, e.g., electron beams, which are generated and focused in charged particle beam devices, such as electron microscopes or electron beam pattern generators. Charged particle beams offer superior spatial resolution compared to, e.g., photon beams due to their short wavelengths.

Signals can be generated, for example, by detection of secondary particles released from a specimen on impingement of a primary charged particle beam. Thereby, it is desirable to improve efficiency and homogeneity of the detection.

SUMMARY OF THE INVENTION

In light of the above, the present invention intends to provide an improved assembly for a detection unit for an optical device and an improved charged particle beam device.

The object is solved by the assembly for a detection unit for an optical device according to independent claim 1 and the charged particle device according to claim 14.

According to one embodiment, a detection unit for an optical device is provided. The detection unit includes a scintillator or a scintillator disc, respectively. The scintillator is suitable for receiving secondary particles and, in response, generating photons. The scintillator includes an opening for trespassing of a primary beam, e.g., a charged particle beam, through the scintillator. The scintillator including the opening being asymmetrical.

According to another embodiment, a charged particle beam device is provided. The charged particle beam device includes a detector for generation of a signal. The detector includes a scintillator, a light guide and a photon detection element. The scintillator including an opening for trespassing of a primary charged particle beam is shaped asymmetrically to be adapted to reduce the probability for multiple photon deflections between the outer edge of the scintillator and the edge of the opening within the scintillator.

Embodiments are also directed to apparatuses for carrying out the disclosed methods and including apparatus parts for performing each described method steps. These method steps may be performed by way of hardware components, a computer programmed by appropriate software, by any combination of the two or in any other manner. Furthermore, embodiments are also directed to methods by which the described apparatus operates or by which the described apparatus is manufactured. It includes method steps for carrying out every function of the apparatus or manufacturing every part of the apparatus.

BRIEF DESCRIPTION OF THE DRAWINGS

Some of the above indicated and other more detailed aspects of the invention will be described in the following description and partially illustrated with reference to the figures. Therein.

DETAILED DESCRIPTION OF THE DRAWINGS

Without limiting the scope of protection of the present application, in the following the charged particle beam device or components thereof will exemplarily be referred to as an electron beam device or components thereof. Thereby, the electron beam might especially be utilized for inspection or lithography. The present invention can still be applied for apparatuses and components using other sources of charged particles and/or other secondary and/or backscattered charged particles to obtain a specimen image or to pattern a specimen.

Within the following description of the drawings, the same reference numbers refer to the same components. Generally, only the differences with respect to the individual embodiments are described.

A "specimen" as referred to herein, includes, but is not limited to, semiconductor wafers, semiconductor workpieces, and other workpieces such as optical planks, memory disks and the like. Embodiments of the invention may be applied to any generally flat workpiece on which material is deposited or which are structured. A specimen includes a flat surface to be structured or on which layers are deposited.

Figure 1:
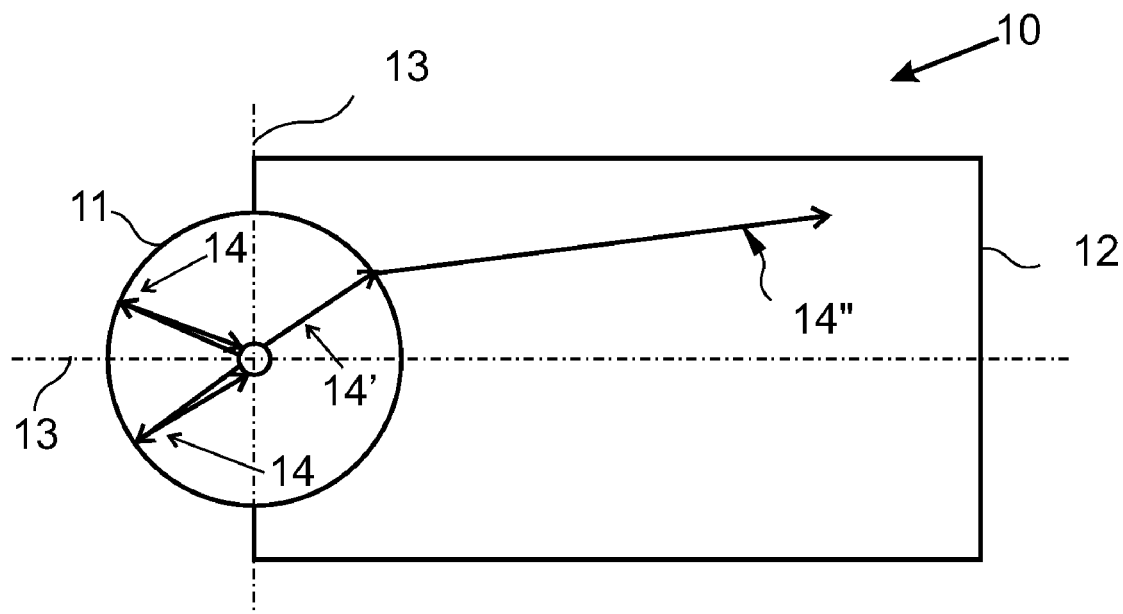
FIG. 1 shows a first example that is useful for understanding.

FIG. 1 illustrates a first example which is useful for understanding. An assembly 10 for a detection unit includes a scintillator 11 and a light guide 12. The photons generated in the scintillator material enter light guide 12. Therein, the photons are guided to a detection element (not shown) for the photons.

For detection of backscattered or secondary particles, particularly in a backward direction with regard to a primary electron beam of an electron beam device, the detection unit generally is arranged on the optical axis. Thereby, the signal to be detected and being released from a specimen in a backward direction or essentially in a backward direction can be detected. In light thereof, an opening is provided in the center of the circular scintillator disc. A primary electron beam that is to be directed onto a specimen can, thus, trespass the detector even though the detector is arranged in a backward direction.

Within FIG. 1, several photon paths 14, 14', 14" are shown. A photon generated on the side of the scintillator disc, on which the light guide is provided (right side in FIG. 1), can easily follow path 14' and enter the light guide to further follow path 14". A photon generated on a side of the scintillator disc, which is opposite to the light guide (left side in FIG. 1), might have a photon path 14. The photon travels to the edge of the scintillator 11 and is reflected. The scintillator 11 including the opening is rotationally symmetric. It is, two-dimensionally, reflection symmetric with respect to the two axes 13. The symmetry of the disc increases the probability that the photon is reflected back towards the opening within the scintillator disc. There, even a further reflection to the edge of the scintillator 11 and back can occur. Thus, photons generated on the light-guide-opposite side have a smaller probability to enter the light guide than photons generated in the light-guide-oriented side of the scintillator disc. Thus, the overall efficiency and the homogeneity, particularly the spatial homogeneity regarding the orientation of the light guide in the system, are insufficient.

Figure 2:
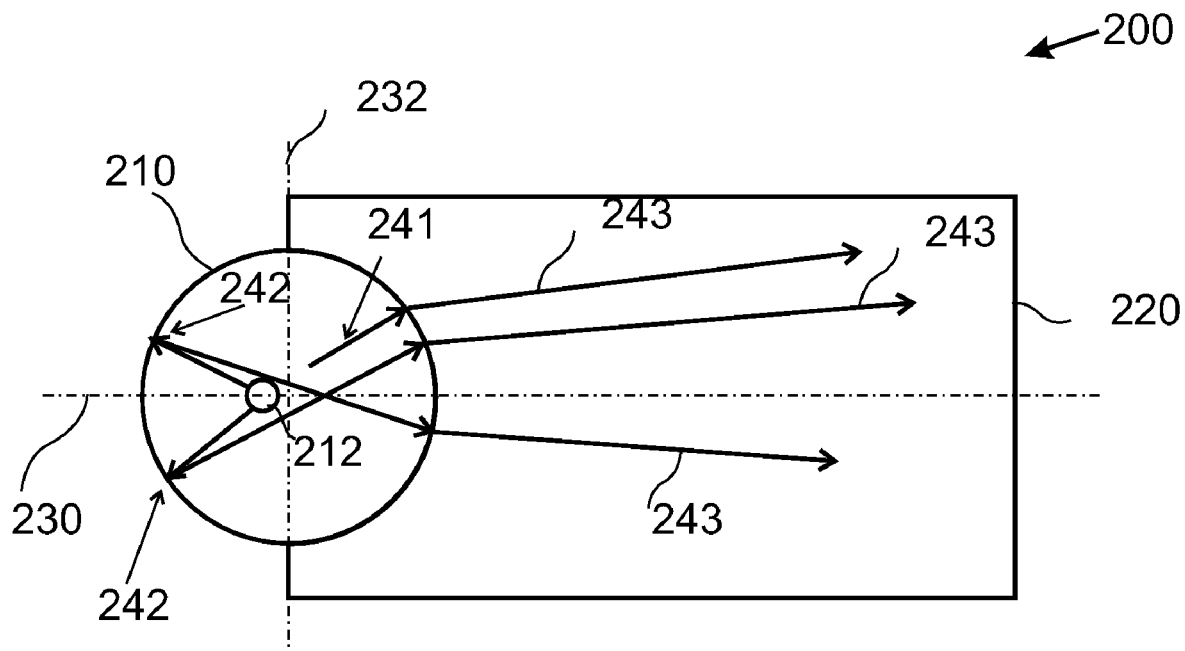
FIG. 2 shows an embodiment of an assembly for a detection unit with a scintillator including an opening.

FIG. 2 shows an embodiment of an assembly 200 for a detection unit. The scintillator includes a material or substance that absorbs high energy electromagnetic or charged particle radiation. In response to this previously absorbed energy, photons are generated. The materials generally have a short fluorescence decay time (short dead time) and optical transparency at wavelengths of their own specific emission energy. Examples of scintillators include: SPI P-47 powder scintillator, single crystal scintillators of YAG and YAP, thallium-doped sodium iodide crystals, bismuth germanate (BGO) coincidence detectors, cerium-doped yttrium aluminum garnet (Ce:YAG). Common scintillators used for radiation detection include inorganic crystals, plastics, and organic liquids, e.g., thallium-doped sodium iodide crystals.

The scintillator 210 can typically be provided as a disc. According to one embodiment, the scintillator disc has a diameter from about 10 mm to about 30 mm and a thickness from about 1 mm to about 6 mm. According to another embodiment, the scintillator 210 has a diameter from about 15 mm to about 20 mm and a thickness from about 2 mm to about 4 mm.

The light guide can typically be provided as a rod of a glass material, a plastics material, or the like. The rod is connected to the scintillator such that photons from the scintillator can enter the light guide. According to one embodiment, the light guide and the scintillator are connected by adhesive. According to a further embodiment, the edge between the scintillator and the light guide may be conically shaped (see, e.g., FIG. 6, not shown in FIG. 2). Thereby, the probability of photons being reflected back from the light guide towards the scintillator can be reduced. The rod of the light guide 220 may be in form of a cylinder with a diameter from about 12 mm to about 25 mm.

The opening 212 within the scintillator 210 is positioned such that the scintillator including the opening is symmetric with regard to symmetry axis 230. The opening 212 within the scintillator 210 is positioned such that the scintillator including the opening is asymmetric with regard to axis 232. There is no axis parallel to axis 232 or non-parallel to axis 230, which could, additionally, be considered a symmetry axis for the scintillator including the opening. The introduced asymmetry reduces the probability that photons generated within scintillator disc on the light-guide-opposite side are reflected or multiple times reflected between the edge of scintillator 210 and opening 212.

Within FIG. 2, several photons paths 242, 241, 243 are shown. A photon generated on the side of the scintillator disc 210, on which the light guide is provided (right side in FIG. 2), can follow path 241 and enter the light guide to further follow path 243. A photons generated on a side of the scintillator disc 210, which is opposite to the light guide (left side in FIG. 2), might have a photon path 242. According to photon paths 242, the photons travel to the edge of the scintillator disc 210 and are reflected. The asymmetry of the scintillator disc including the opening 212 reduces the probability that the photons are reflected back towards the opening 212 within the scintillator 210. The photons described with photon paths 242 pass at a side of opening 212 after one reflection at the edge of scintillator 210. Afterwards, they enter light guide 220 to follow paths 243. The photons guided through the light guide 220 are detected by a photomultiplier (PMT) (not shown) or a semiconductor detector arranged at the light guide side opposite the scintillator 210.

Within FIG. 2, the asymmetry generated by dislocating the opening 212 from axis 232 reduces a loss of photons by a plurality of reflections between the edge of the scintillator 210 and the opening 212. The number of reflections of a photon generated in the light-guide-opposing side required until the photon enters the light guide is reduced. The overall efficiency and the homogeneity, particularly the spatial homogeneity regarding the orientation of the light guide in the system, are increased. The homogeneity with regard to the symmetry axis 230 is maintained in light of the symmetric arrangement of the opening 212 with regard to axis 230.

The symmetries being referred to within respect to the embodiments described in FIGS. 1 to 5, and which are sometimes denoted as a two-dimensional symmetry with regard to symmetry axes, are to be understood as reflection symmetries in two dimensions. As may be understood from the embodiments described herein, typically, the two-dimensional plane to be considered is the plane essentially perpendicular to the optical axis of, for example, an electron beam device. Generally, the plane to be considered does not include the optical axis of the entire system.

Within FIG. 2, according to one embodiment, the opening 212 has a diameter from about 0.5 mm to 5 mm. According to another embodiment, the opening has a diameter from about 1 mm to 2 mm. According to yet another embodiment, considering the diameters of the opening for a respective embodiment, the distance of the center of the opening 212 from axis 232 is at least the diameter of the opening 212.

According to another embodiment, the side of the scintillator 210, which is opposite to the light guide 220, can be approximated by a parabolic curve or a part of an ellipse. The center of the opening is about positioned in the focus of the parabola or the corresponding focus of the two foci of the ellipse, respectively. Thereby, a reflection at the edge of the scintillator 210 towards the light guide might be further improved.

Within the embodiments described with respect to FIG. 2, an asymmetry of the scintillator 210, e.g., in form of a scintillator disc, including the opening 212 has been introduced by positioning the opening 212 outside the center of the circular scintillator. Thereby, the manufacturing of the scintillator, particularly in the case a single crystal scintillator material is used, is simplified. Manufacturing of a circular disc is easier than manufacturing of an asymmetric disc.

Figure 3A:
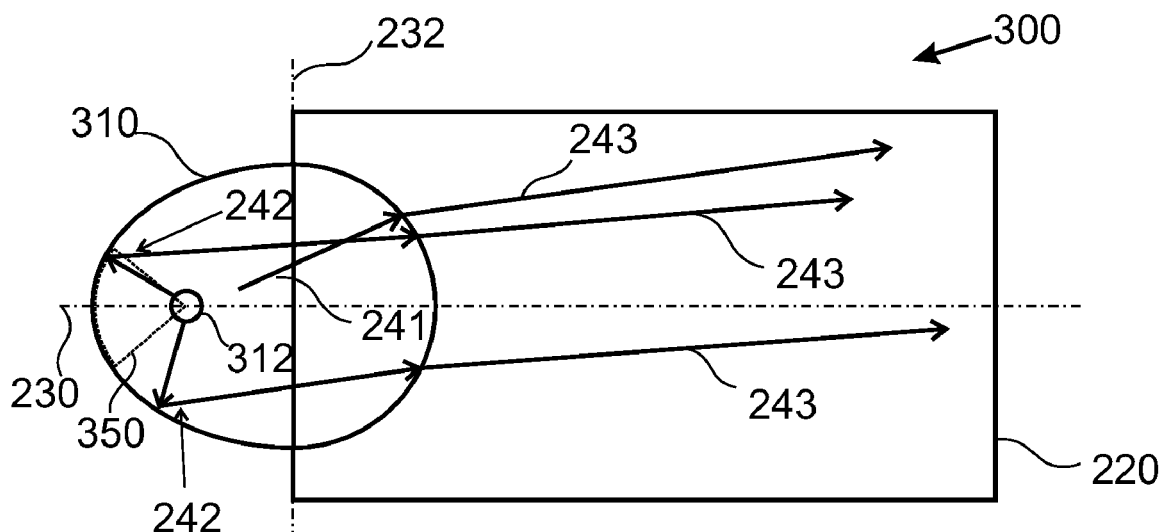
FIGS. 3A and 3B show embodiments of assemblies for a detection unit with a scintillator including an opening.
Figure 3B:
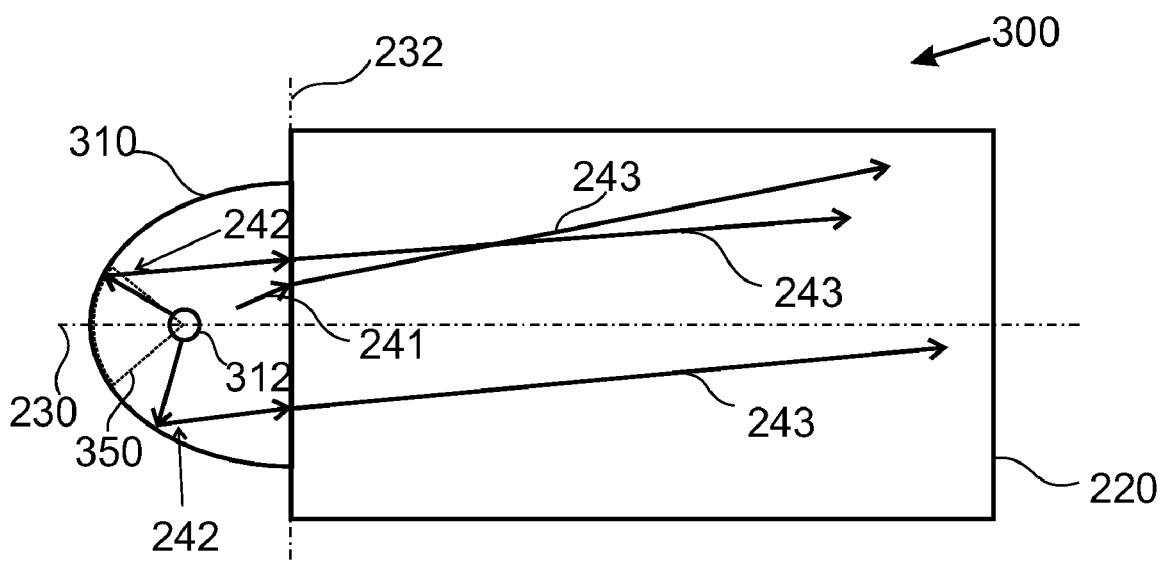

However, an asymmetry for reducing the probability for a reflection between the edge of the scintillator and the opening within the scintillator or the probability for multiple reflection between the edge of the scintillator and the opening within the scintillator can also generated by manufacturing an asymmetric scintillator as, for example, shown in FIGS. 3A and 3B.

FIG. 3A shows an embodiment of an assembly 300 for a detection unit. The scintillator includes a material or substance as described with respect to FIG. 2. The scintillator 310 can typically be provided as a disc.

The circumference of the disc has a shape with parts being elliptical or parabolic. Thereby, the portion of the disc being on the right hand side of axis 232, that is the light-guide-oriented side, is shaped similarly to the scintillator 210 shown in FIG. 2. The left hand side is shaped such that particularly the very left side section, that is a section of the light-guide-opposing side, has a parabolic shape. The parabolic shape has a focus. The parabolic shape and the focus are indicated with dotted lines denoted by reference sign 350. According to an embodiment the opening 312 within the scintillator 310 is positioned to be in the focus.

Within FIG. 3A, according to one embodiment, the opening 312 has a diameter from about 0.5 mm to 5 mm. According to another embodiment, the opening has a diameter from about 1 mm to 2 mm. According to another embodiment, the parabolic or elliptical circumference results in a geometrical focus. The center of the opening 312 is about positioned in this focus. Thereby, a reflection at the edge of the scintillator 310 towards the light guide might be further improved.

Further embodiments, can be devised by providing light guide 220 in FIG. 3A according to one of the light guide assemblies described with respect to FIG. 2.

The opening 312 within the scintillator 310 is positioned such that the scintillator including the opening is symmetric with regard to symmetry axis 230. The opening 312 within the scintillator 310 is positioned such that the scintillator including the opening is asymmetric with regard to axis 232. There is no axis parallel to axis 232 or non-parallel to axis 230, which would be considered a further symmetry axis for the scintillator including the opening. The introduced asymmetry reduces the probability that photons generated within scintillator disc on the light-guide-opposite side are reflected or multiple times reflected between the edge of scintillator 310 and opening 312.

Within FIG. 3A, several photon paths 242, 241, 243 are shown. A photon generated on the side of the scintillator disc 310, on which the light guide 220 is provided (right side in FIG. 2), can follow path 241 and enter the light guide to further follow path 243. A photon generated on a side of the scintillator disc 310, which is opposite to the light guide 220 (left side in FIG. 2), might have a photon path 242. According to photon paths 242, the photons travel to the edge of the scintillator disc 310 and are reflected. The asymmetry of the scintillator disc including the opening 312 reduces the probability that the photons are reflected back towards the opening 312 within the scintillator 310. The photons described with photon paths 242 pass at a side of opening 312 after one reflection at the edge of scintillator 310. Afterwards, they enter light guide 220 to follow paths 243. Thereby, the overall efficiency and the homogeneity, particularly the spatial homogeneity regarding the orientation of the light guide in the system, are increased. The homogeneity with regard to the symmetry axis 230 is maintained in light of the symmetric arrangement of the opening 312 and the scintillator 310 with regard to axis 230.

FIG. 3B shows another embodiment of an assembly 300 for a detection unit. The scintillator 310 can typically be provided as a disc. The circumference of the disc has a shape with a left portion being elliptical or parabolic. The portion of the disc being on the right hand side of axis 232, that is the light-guide-oriented side, is shaped to have a straight edge towards the light guide 220. The left hand side is shaped such that particularly the very left side section, that is a section of the light-guide-opposing side, has a parabolic shape. The parabolic shape has a focus. The parabolic shape and the focus are indicated with dotted lines denoted by reference sign 350. Generally, for the embodiment described herein, if reference is made to at least a portion of the scintillator, for example in the case of the parabolic circumferential portion or the circumferential portion of an ellipse, respectively, the at least a portion of the scintillator is a portion of the circumference, for example at least 10%, 20% or even 50% of the circumference of the scintillator. According to another embodiment, the opening 312 within the scintillator 310 is positioned to be in the focus. Further embodiments may be derived similar to the embodiments described with respect to FIG. 3A. For example, the opening 312 might be slightly displaced from the focus by 2 or 3 millimeters.

For some applications space requirements within, for example, an electron beam column might be considered for the assembly for a detection unit. Generally, the assembly is at least partly positioned within the column. The detector like a PMT or a semiconductor detector may be positioned outside the column. The light guide is used to guide the photons from the scintillator inside the column to the detector outside the column. In light thereof the scintillator and the light guide may be subject to spatial requirements.

Embodiments described herein can analogously be realized in such a case. Thereby, a dimension of the scintillator and the light guide is reduced without abandoning the symmetrical conditions described with regard to other embodiments.

Figure 4:
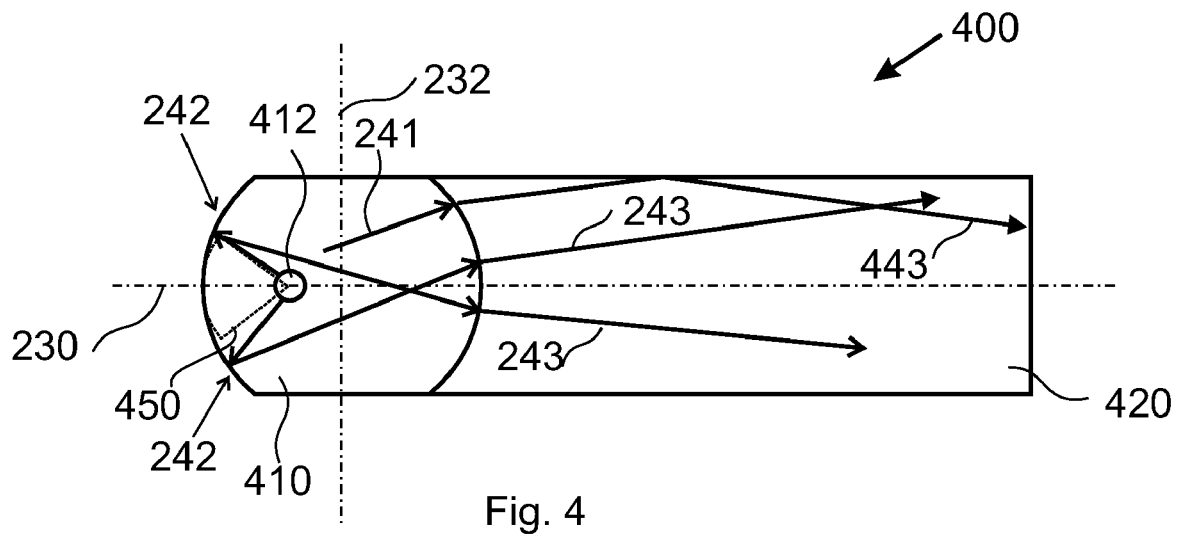
FIG. 4 shows an embodiment of an assembly for a detection unit with a scintillator including an opening and having a modified contour.

FIG. 4 shows an embodiment of an assembly 400 for a detection unit. The scintillator 410 includes a material or substance as described with respect to FIG. 2. The scintillator 410 can typically be provided as a disc.

The light guide and the scintillator have a reduced dimension in the direction of axis 232. Thereby, within FIG. 4, a lower portion and an upper portion of the scintillator 410 and the light guide 520 are omitted. The omitted portions are symmetrical with respect to symmetry axis 230. Thereby, the symmetry is maintained. Thus, it is possible to realize an assembly with a reduced dimension that provides a similar homogeneity. The efficiency might be reduced based on the reduced detection area. However, this decrease of efficiency depends on the detection area. A detector with reduced detection area and without utilizing the present invention would have an even smaller efficiency. Thus, the efficiency is analogously improved.

Within FIG. 4, according to one embodiment, the opening 412 has a diameter from about 0.5 mm to 5 mm. According to another embodiment, the opening has a diameter from about 1 mm to 2 mm. According to yet another embodiment, considering the diameters of any of the other embodiments, the distance of the center of the opening 412 from axis 232 is at least the diameter of the opening 412.

According to another embodiment, the side of the scintillator 410, which is opposite to the light guide 420, can be approximated by a parabolic curve or a part of an ellipse. The center of the opening is about positioned in the focus of the parabola or the corresponding focus of the two foci of the ellipse, respectively. The parabolic shape and the focus are indicated with dotted lines denoted by reference sign 450. Thereby, a reflection at the edge of the scintillator 410 towards the light guide might be further improved.

According to one embodiment, the light guide can typically be provided as a rod of a glass material, a plastics material, or the like. The rod is connected to the scintillator such that photons from the scintillator can enter the light guide. According to one embodiment, the light guide and the scintillator are connected by adhesive. According to a further embodiment, the edge between the scintillator and the light guide may be conically shaped (see, e.g., FIG. 6, not shown in FIG. 2). Thereby, the probability of photons being reflected back from the light guide towards the scintillator can be reduced.

The above mentioned modified contour of the assembly for a detection unit can be realized by modifying the contour of a circular, i.e., cylindrical shaped rod. According to an alternative, a rectangular or square shaped rod can be used.

The opening 412 within the scintillator 410 is positioned such that the scintillator including the opening is symmetric with regard to symmetry axis 230. Further, axis 232 does not provide a symmetry axis for the scintillator 410 including the opening 412. The introduced asymmetry improves the efficiency and the homogeneity of the assembly for the detection unit.

Within FIG. 4, several photons paths 242, 241, 243 are shown. Similar conditions as described with respect to FIG. 2 are provided for the photons paths. In light of the reduced width (along axis 232) of the assembly 400, the probability for reflections at the edges providing the shortened dimension is increased for the scintillator 410 and the light guide 420. This can, exemplarily, be seen by photon path 443 within light guide 420. The photon is reflected back into the light guide at the edge of the light guide.

Figure 5:
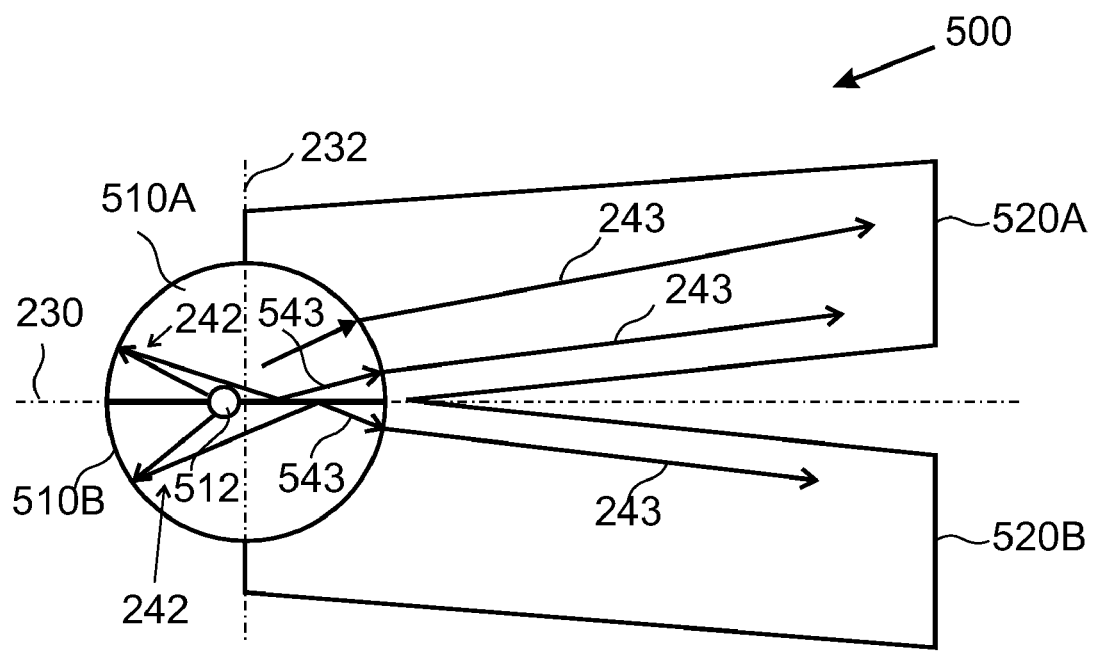
FIG. 5 shows an embodiment of a segmented assembly for a detection unit with a scintillator including an opening.

FIG. 5 shows another embodiment of an assembly 500 for a detection unit. According thereto, the scintillator is segmented in segments 510A and 510B. The light guide is provided with corresponding portions 520A and 520B. Finally, two PMTs (not shown) or two semiconductor detectors (not shown) detect photons provided by light guide portions 520A and 520B, respectively. In light thereof, the information whether the photon was generated within scintillator segment 510A or within scintillator segment 510B can be gained. Therefore, it can be concluded in which segment the high energy electromagnetic or charged particle radiation hit the scintillator. This information can, for example, be used if a release direction from the specimen has a higher probability. As an example, this might occur based on the topography of the specimen. A topographic information, or the like from the specimen may, therefore, be detected by the segmented scintillator and the two-part light guide. According to another embodiment, three or more segments can be applied.

Within FIG. 5, the scintillator having the segments 510A and 510B includes a material or substance as described with respect to FIG. 2. The scintillator 510 including segments 510A and 510B can typically be provided as a disc.

Within FIG. 5, according to one embodiment, the opening 512 within the scintillator has a diameter from about 0.5 mm to 5 mm. According to another embodiment, the opening has a diameter from about 1 mm to 2 mm. According to another embodiment, the parabolic or elliptical circumference results in a geometrical focus. The center of the opening 512 is about positioned in this focus. Thereby, a reflection at the edge of the scintillator segments 510A and 510B towards the light guide might be further improved.

Further embodiments, can be devised by providing light guide portions 520A and 520B in FIG. 5 according to one of the light guide modifications according to the description with respect to FIG. 2.

The opening 512 within the scintillator including segments 510A and 510B is positioned such that the scintillator including the opening is symmetric with regard to symmetry axis 230. The opening 512 within the scintillator is positioned such that the scintillator including the opening is asymmetric with regard to axis 232. Further, axis 232 does not provide a symmetry axis for the scintillator including the opening 512. The introduced asymmetry improves the efficiency and the homogeneity of the assembly for the detection unit.

Within FIG. 5, several photons paths 242, 543, 243 are shown. In light of the edge between the two scintillator segments 510A and 510B, the photons can be reflected such that the photons do not propagate from on segment to the other and vice versa. Thereby, the above-described additional information maintains essentially until detection of the photons. The reflection can, for example, be seen by photon paths 543 within segments 510A or by photon paths 543 within segments 510B. The photon is reflected back into the same segment at the edge between the two segments.

Figure 6:
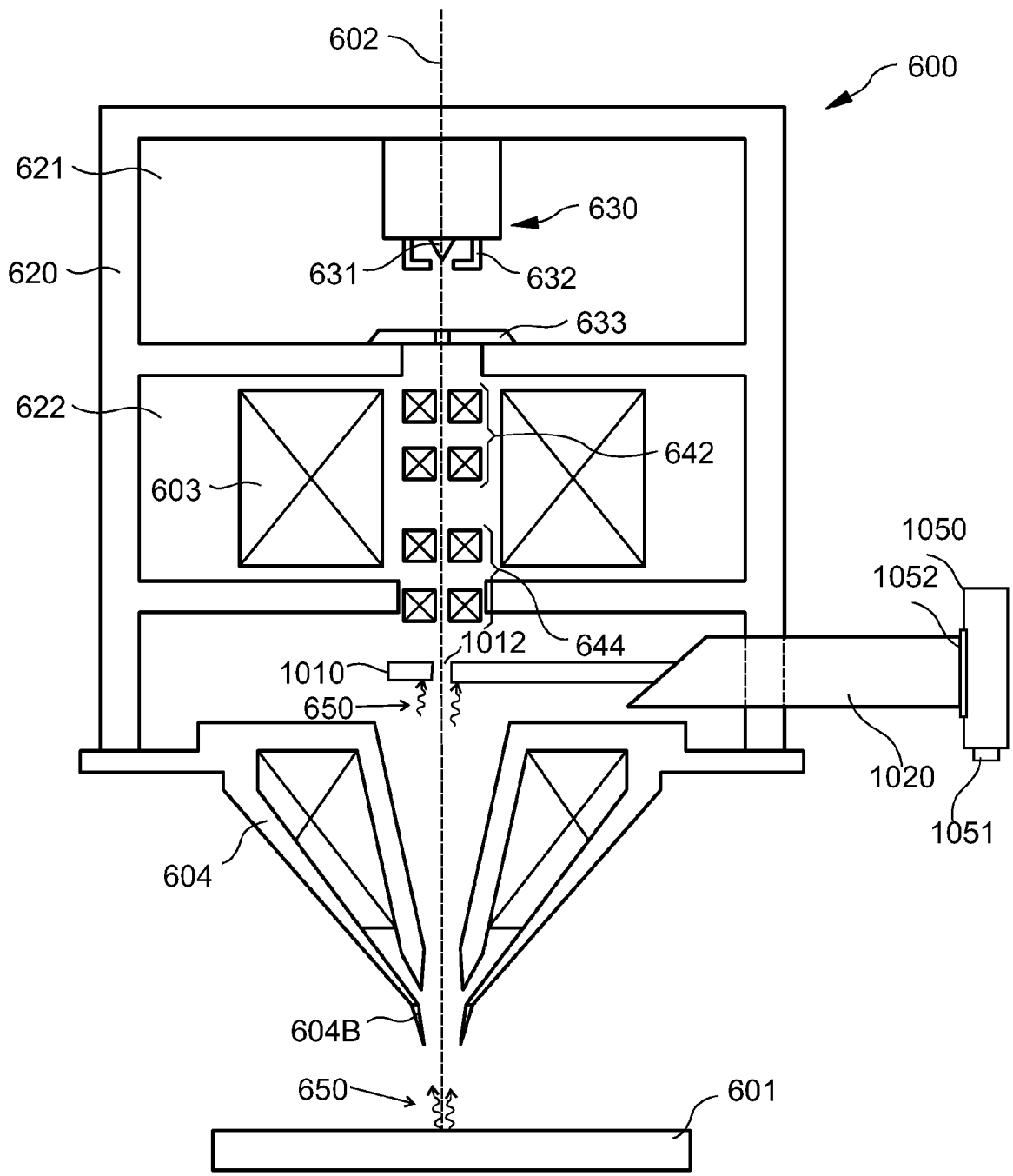
FIG. 6 shows an embodiment of a charged particle beam device with an assembly according to any of the embodiments of FIGS. 2 to 5 with a scintillator including an opening.

An embodiment of a charged particle beam device 600 is shown in FIG. 6. Electron gun 630 includes an emitter 631 and suppressor 632. The primary electron beam is emitted essentially along optical axis 602. The gun chamber 621 of housing 620 is separated by aperture 633 from the following chamber 622. The aperture 633 can also act as an anode. The primary electron beam is formed and guided by condenser lens 603 and deflection units 642 and 644 for alignment of the primary electron beam. The primary electron beam passes through the opening 1012 in scintillator 1010 and is focused by primary objective lens 604 including electrode 604B.

On impingement of the primary electron beam on the specimen 601, secondary particles and/or backscattered particles 650 are released. Other radiation to be used as a signal from the specimen may be X-rays, photons and the like. These signals 650 impinge on scintillator 1010. As described with regard to the embodiments described in FIGS. 1 to 5, the scintillator 1010 and the light guide 1020 are shaped to provide improved efficiency and homogeneity. Light guide 1020 guides the photons through a feedthrough in the column housing 620. PMT 1050, which includes a window 1052 and is electrically connected via socket 1051, generates electrical signals in response to the photons.

While the foregoing is directed to embodiments of the invention, other and further embodiments of the invention may be devised without departing from the basic scope thereof, and the scope thereof is determined by the claims that follow.

The invention claimed is:

1. An assembly for a detection unit for an optical device, comprising:
    a scintillator adapted to receive secondary particles and, in response, generate photons, wherein the scintillator includes an opening for trespassing of a primary beam through the scintillator;
    the scintillator including the opening being asymmetrical with regard to one axis of a two-dimensional symmetry, wherein the one axis is a symmetry axis of the scintillator.

2. The assembly according to claim 1, wherein the scintillator including the opening has a further two-dimensional symmetry comprising:
    the scintillator including the opening being essentially symmetrical with regard to a further axis.

3. The assembly according to claim 2, wherein the scintillator is essentially symmetrical with regard to the further axis and being essentially symmetrical with regard to the one axis, and wherein the opening is positioned essentially symmetrical with regard to the further axis and asymmetrical with regard to the one axis.

4. The assembly according to claim 1, wherein the scintillator is a scintillator disc.

5. The assembly according to claim 1, further comprising a light guide adjacent to the scintillator.

6. The assembly according to claim 5, wherein an arrangement including the light guide, the scintillator and the opening is essentially symmetrical with regard to a further axis.

7. The assembly according to claim 5, wherein at least one portion of a circumference of the scintillator is an elliptical portion or a parabolic portion and is at an opposite side of the scintillator than the light guide.

8. The assembly according to claim 5, wherein at least one portion of a circumference of the scintillator is an elliptical portion and is at an opposite side of the scintillator than the light guide, and wherein the opening is positioned in a focus of the elliptical portion.

9. The assembly according to claim 1, wherein the scintillator is a circular scintillator disc and the opening is positioned distant to the center of the circular scintillator disc.

10. The assembly according to claim 1, wherein the scintillator originates from a circular scintillator disc and has a contour of a modified circle and the opening is positioned distant to the center of the circular scintillator disc.

11. The assembly according to claim 1, wherein the opening is positioned distant from the one axis by at least a distance similar to the diameter of the opening.

12. The assembly according to claim 1, wherein the opening is positioned distant from the one axis by at least a distance of about 2 mm.

13. The assembly according to claim 1, wherein the scintillator is segmented.

14. The assembly according to claim 13, wherein the scintillator has two segments.

15. A charged particle beam device, comprising:
   a charged particle beam emitter for emitting a charged particle beam along an emitting direction;
   an objective lens for focusing the charged particle beam on a specimen; and
   a detection unit comprising:
   a scintillator being adapted to receive secondary particles and, in response, generate photons, wherein the scintillator includes an opening for trespassing of the charged particle beam through the scintillator;
      the scintillator including the opening being asymmetrical with regard to one axis of a two-dimensional symmetry, wherein the one axis is a symmetry axis of the scintillator.

16. The charged particle beam device according to claim 15, wherein the detection unit is arranged on a side of the objective lens opposite to the specimen.

* * * * *